US 6,717,226 B2

(54) TRANSISTOR WITH LAYERED HIGH-K GATE DIELECTRIC AND METHOD THEREFOR

(75) Inventors: Rama I. Hegde, Austin, TX (US); Joe Mogab, Austin, TX (US); Philip J. Tobin, Austin, TX (US); Hsing H. Tseng, Austin, TX (US); Chun-Li Liu, Mesa, AZ (US); Leonard J. Borucki, Mesa, AZ (US); Tushar P. Merchant, Gilbert, AZ (US); Christopher C. Hobbs, Austin, TX (US); David C. Gilmer, Austin, TX (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 10/098,706

(22) Filed: Mar. 15, 2002

(65) Prior Publication Data

US 2003/0176049 A1 Sep. 18, 2003

(51) Int. Cl.$^7$ .......................... H01L 29/76; H01L 29/94; H01L 31/113; H01L 31/119

(52) U.S. Cl. ....................... 257/406; 257/410; 257/411; 438/216; 438/261; 438/591

(58) Field of Search ................................. 257/405, 406, 257/410, 411; 438/216, 261, 288, 591

(56) References Cited

U.S. PATENT DOCUMENTS

| | | | |
|---|---|---|---|
| 5,153,701 A | | 10/1992 | Roy |
| 5,292,673 A | * | 3/1994 | Shinriki et al. ............. 438/287 |
| 5,885,877 A | | 3/1999 | Gardner et al. |
| 6,090,686 A | | 7/2000 | Brady et al. |
| 6,235,594 B1 | | 5/2001 | Merchant et al. |
| 6,320,244 B1 | | 11/2001 | Alers et al. |
| 6,340,827 B1 | | 1/2002 | Choi et al. |
| 6,407,435 B1 | * | 6/2002 | Ma et al. ..................... 257/411 |
| 6,444,592 B1 | * | 9/2002 | Ballantine et al. .......... 438/758 |
| 6,451,641 B1 | * | 9/2002 | Halliyal et al. ............. 438/200 |
| 2001/0013629 A1 | * | 8/2001 | Bai ............................ 257/411 |
| 2001/0024387 A1 | | 9/2001 | Raaijmakers et al. |
| 2001/0053601 A1 | * | 12/2001 | Mogami ...................... 438/658 |
| 2002/0115252 A1 | * | 8/2002 | Haukka et al. .............. 438/240 |

FOREIGN PATENT DOCUMENTS

| | | |
|---|---|---|
| DE | 19903598 A1 | 8/2000 |
| EP | 1124262 A2 | 8/2001 |

OTHER PUBLICATIONS

D. Prot et al., "Self–diffusion in α–Al$_2$O$_3$ IL Oxygen diffusion in 'undoped' single crystals", 1996 Taylor & Francis Ltd., Philosophical Magazine A, 1996, vol. 73, No. 4, pp. 899–917.

H. Bender et al., "Physical Characterisation of High–k Gate Stacks Deposited on HF–Last Surfaces", IWGI 3002, Tokyo, pp. 1–7.

(List continued on next page.)

Primary Examiner—David A. Zarneke
Assistant Examiner—Asok Kumar Sarkar
(74) Attorney, Agent, or Firm—Kim-Marie Vo; James L. Clingan, Jr.

(57) ABSTRACT

A transistor device has a gate dielectric with at least two layers in which one is hafnium oxide and the other is a metal oxide different from hafnium oxide. Both the hafnium oxide and the metal oxide also have a high dielectric constant. The metal oxide provides an interface with the hafnium oxide that operates as a barrier for contaminant penetration. Of particular concern is boron penetration from a polysilicon gate through hafnium oxide to a semiconductor substrate. The hafnium oxide will often have grain boundaries in its crystalline structure that provide a path for boron atoms. The metal oxide has a different structure than that of the hafnium oxide so that those paths for boron in the hafnium oxide are blocked by the metal oxide. Thus, a high dielectric constant is provided while preventing boron penetration from the gate electrode to the substrate.

7 Claims, 1 Drawing Sheet

OTHER PUBLICATIONS

R.J. Carter et al., "Electrical Characterisation of High–K Materials Prepared by Atomic Layer CVD", IWGI 2001, Tokyo, pp. 1–6.

L. Manchanda et al., "Multi–component high–K gate dielectrics for the silicon industry", Elsevier Science B.V., pp. 351–359.

V.V. Afanas'ev[a] et al., "Energy barriers between (100)Si and $Al_2O_3$ and $ZrO_2$–based dielectric stacks: internal electron photoemission measurements", 2001 Elsevier Science B.V. All rights reserved, pp. 335–339.

Massimo Fischetti et al., "IBM Research Report", RC 22092 (99048) Jun. 12, 2001, pp. 1–25.

D.A. Neumayer et al., "Materials characterization of $ZrO_2$–$SiO_2$ and $HfO_2$–$SiO_2$ binary oxides deposited by chemical solution deposition", 2001 American Institute of Physics, Journal of Applied Physics, vol. 90, No. 4, Aug. 15, 2001, pp. 1801–1808.

Toyokazu Tambo et al., "Molecular Beam Epitaxy of $SrTiO_3$ Films on Si(100)–2x1 with SrO Buffer Layer", 1998 Publication Board, Japanese Journal of Applied Physics, Jpn. J. Appl. Phys. vol. 37 (1998), pp. 4454–4459.

PCT International Search Report (PCT/US03/07745).

* cited by examiner

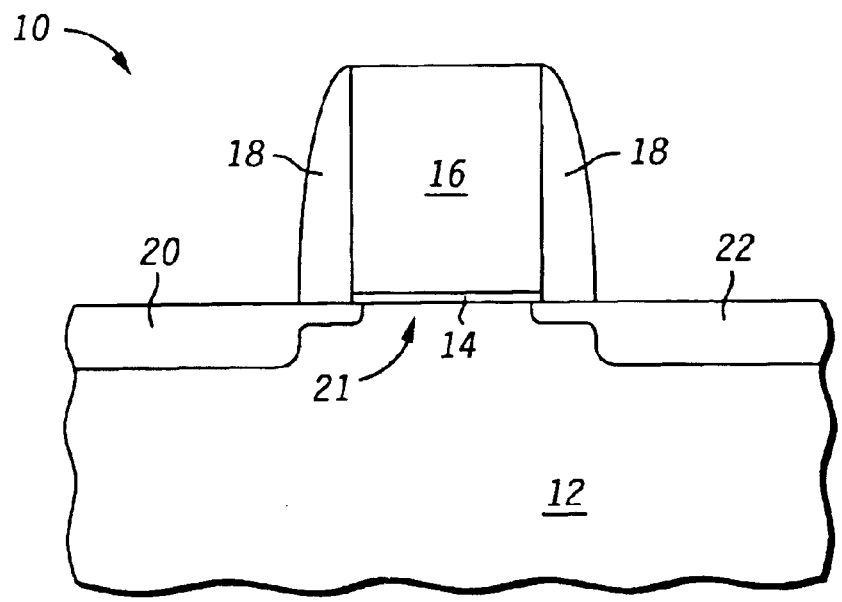
*FIG.1*
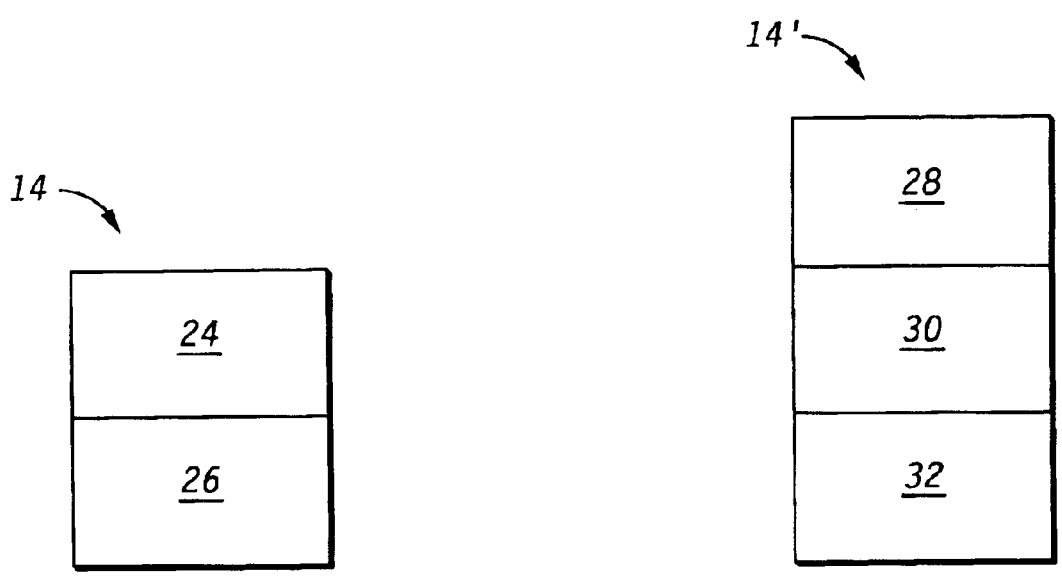
*FIG.2*  *FIG.3*

TRANSISTOR WITH LAYERED HIGH-K GATE DIELECTRIC AND METHOD THEREFOR

FIELD OF THE INVENTION

This invention relates generally to semiconductor processing, and more specifically, to gate dielectrics of semiconductors.

BACKGROUND

In semiconductor processing, a gate electrode lying over a gate dielectric is typically formed of polysilicon. The gate electrode is usually doped with boron to increase the conductivity of the gate electrode. During subsequent processing at temperatures greater than approximately 900 degrees Celsius, the boron diffuses through the gate dielectric to an underlying semiconductor substrate, undesirably making the underlying semiconductor substrate more conductive. The increased conductivity of the underlying semiconductor substrate, which is typically silicon, decreases the performance of a semiconductor device.

Typically, the gate dielectric is silicon dioxide ($SiO_2$). Due to the scaling of semiconductor devices, however, $SiO_2$ is being replaced with high dielectric constant (high-k) materials, where the dielectric constant is greater than approximately the dielectric constant of $SiO_2$. Since the high-k materials being proposed for the gate dielectric, especially hafnium oxide ($HfO_2$), are generally less amorphous than $SiO_2$ the high-k materials permit more boron to diffuse through the high-k material to the semiconductor substrate. Therefore, a need exists for a gate dielectric that has a high dielectric constant and substantially prevents boron diffusion from the gate electrode to the semiconductor substrate.

BRIEF DESCRIPTION OF THE DRAWINGS

The present invention is illustrated by way of example and is not limited by the accompanying figures, in which like references indicate similar elements.

FIG. 1 illustrates a cross-sectional view of a semiconductor device having a gate electrode, a gate dielectric, a source and a drain in accordance with an embodiment of the present invention;

FIG. 2 illustrates the gate dielectric of FIG. 1 in accordance with one embodiment of the present invention; and FIG. 3 illustrates the gate dielectric of FIG. 1 in accordance with another embodiment of the present invention.

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION OF THE DRAWINGS

Illustrated in FIG. 1 is a semiconductor or transistor device 10, which is part of an integrated circuit, having a semiconductor substrate 12, a gate dielectric 14 formed over the semiconductor substrate, a gate electrode 16 formed over the gate dielectric 14, spacers 18 adjacent the sidewalls of the gate dielectric 14, and a first current electrode 20 and a second current electrode 22 formed within the semiconductor substrate 12. The semiconductor substrate 12 can be any semiconductor material such as silicon, silicon germanium, gallium arsenide, and the like. Additionally, the semiconductor substrate 12 can be a silicon layer of a semiconductor on insulator substrate (SOI).

The gate electrode 16 can be a metal, a metal comprising material, or silicon and, preferably, is polysilicon. The spacers 18 on either side of the gate electrode 16 can be any shape and any insulating material. For example, the spacers 18 can be silicon nitride. The spacers 18 are used to isolate the gate electrode 16 from the subsequently formed interlayer dielectric material (ILD) formed over the gate electrode 16 and as a mask for implanting portion of the first current electrode 20 and second current electrode 22. Hence, portions of the first current electrode 20 and second current electrode 22 lie underneath the spacers 18. The first current electrode 20 and the second current electrode 22 are doped regions and are doped with the same conductivity so that a channel 21 forms between them when voltage is applied to the semiconductor substrate. In one embodiment, the first current electrode 20 is a source and the second current electrode 22 is a drain. In another embodiment, the first current electrode is a drain and the second current electrode 22 is a source.

The gate electrode 16, the spacers 18, the first current electrode 20 and the second current electrode 22 can be formed by using any conventional process known to a skilled artisan.

The gate dielectric 14 is a stack of dielectric materials. As shown in FIG. 2, in one embodiment, the gate dielectric 14 is a stack of a first dielectric 24 and a second dielectric 26, where the first dielectric 24 is adjacent the gate electrode 16 and the second dielectric 26 is adjacent the channel 21 between the first current electrode 20 and the second current electrode 22. The first dielectric 24 and the second dielectric 26 are high-k metal oxide materials. In one embodiment, the first dielectric 24 and the second dielectric 26 are substantially pure metal oxide so that the majority or bulk of the first dielectric 24 and second dielectric 26 is a metal oxide. In all the embodiments described below, the materials listed can be substantially pure. For example, substantially pure $HfO_2$ (hafnium oxide), substantially pure $ZrO_2$ (zirconium oxide), or substantially pure $Al_2O_3$ (aluminum oxide) can be used when $HfO_2$, $ZrO_2$, $Al_2O_3$, respectively, is used below.

In a first embodiment, the first dielectric 24 and the second dielectric 26 are different materials and the first dielectric 24 or the second dielectric 26 is $HfO_2$ and the other dielectric has a dielectric constant with a modest high dielectric constant value, such as $ZrO_2$, BaO, $La_2O_3$ and $Y_2O_3$. ($HfO_2$ also has a modest high dielectric constant value of approximately 25.) In one embodiment, the first dielectric 24 is $HfO_2$ and the second dielectric 26 is $ZrO_2$. In another embodiment, the first dielectric 24 is $ZrO_2$ and the second dielectric 26 is $HfO_2$. It is preferable to have the first dielectric 24 be $HfO_2$ and the second dielectric 26 is $ZrO_2$, because $ZrO_2$ reacts to form a silicide with polysilicon but not with the semiconductor substrate if it is a semiconductor material other than polysilicon. Since $HfO_2$ and $ZrO_2$ have grain boundaries that misalign with each other, if boron diffuses through the first dielectric 24 the boron will not have a path to travel from the first dielectric 24 to the second dielectric 26. Thus, the boron does not diffuse into the semiconductor substrate 12.

The first dielectric 24 and the second dielectric 26 can be formed by chemical vapor deposition (CVD), physical vapor deposition (PVD), atomic layer deposition (ALD), the like and combinations of the above. In one embodiment, the gate dielectric 14 is formed by thermally annealing the second dielectric 26 prior to deposition of first dielectric 24. The thermal annealing can be performed in an ambient including nitrogen, oxygen, the like, or combinations of the above, at temperatures from approximately 600 to 1,100 degrees Celsius. The anneal time may be between approximately 3 to 60 seconds. In another embodiment, the gate dielectric 14 can be formed by decoupled plasma nitridation (DPN) of the second dielectric 26 prior to deposition of the first dielectric 24 at a low temperature, which is approximately 50 to 300 degrees Celsius.

In one embodiment, the $HfO_2$ and the $ZrO_2$ are the same physical thickness and are approximately 20 Angstroms or less in physical thickness. In a second embodiment, the first dielectric 24 and the second dielectric 26 are different materials and the first dielectric 24 or the second dielectric 26 is $HfO_2$ and the other dielectric has a dielectric constant with a dielectric constant value that is greater than that of $SiO_2$ and less than that of $HfO_2$ or a modest dielectric constant (a small high dielectric constant value). For example, $Al_2O_3$, which has a dielectric constant of approximately 9, can be used. In one embodiment, the first dielectric 24 is $Al_2O_3$ and the second dielectric 26 is $HfO_2$. The Al2O3 can be formed by any of the methods described for forming $HfO_2$. In a preferred embodiment, the $Al_2O_3$ is formed by ALD and the $HfO_2$ is formed by CVD, or more specifically metal organic CVD (MOCVD). Since ALD allows for the deposition of thin layers of materials, in the preferred embodiment, the HfO2 is substantially at least twice as thick as the $Al_2O_3$. In another embodiment, one monolayer of $Al_2O_3$ is deposited by ALD. Since the $Al_2O_3$ has a lower dielectric constant than $HfO_2$, it is desired to minimizing the thickness of the $Al_2O_3$ in order to make the dielectric constant of the gate dielectric 14 as high as possible. In other embodiments, the first dielectric 24 is $HfO_2$ and the second dielectric 26 is $Al_2O_3$.

$Al_2O_3$ changes from amorphous to polycrystalline or crystalline at temperatures greater than or equal to 1000 degrees Celsius and $ZrO_2$ crystallizes at temperatures greater than or equal to 350 degrees Celsius. Since $Al_2O_3$ is deposited as an amorphous material and the subsequent heating does not change the amorphous state, the $Al_2O_3$ remains amorphous. In other words, processing of the semiconductor device 10 is performed at sufficiently low temperatures to prevent crystallization of the $Al_2O_3$.

Since amorphous structures prevent diffusion, boron diffusion from the gate electrode 16 is minimized by having an amorphous structure in the gate dielectric 14. $Al_2O_3$ also prevents or mitigates the problem of the polysilicon used for the gate electrode 14 regrowing during subsequent processing.

In the embodiment where either the first dielectric 24 or the second dielectric 26 is $ZrO_2$, the $ZrO_2$ may be deposited as amorphous, but during subsequent process the $ZrO_2$ will most likely change from an amorphous state to a polycrystalline or crystalline state.

Other stacked structures can be used to form the gate dielectric 14. An alternative gate dielectric 14', which has three dielectric materials, two of which can be the same but are not in contact with each other. As shown in FIG. 3, the alternative gate dielectric 14' has a third dielectric 28 formed over a fourth dielectric 30, and the fourth dielectric 30 is formed over a fifth dielectric 32. The third dielectric 28 is adjacent the gate electrode 16 and the fifth dielectric 32 is adjacent the channel 21 formed by the first current electrode 20 and the second current electrode 22. The third dielectric 28, the fourth dielectric 30, and the fifth dielectric 32 are metal oxide materials. In one embodiment, the third dielectric 28, the fourth dielectric 30 are substantially pure metal oxide.

In one embodiment, the alternative gate dielectric 14' is preferably less than approximately 20 Angstroms in electrical thickness. In other words in this embodiment, the alternative gate dielectric 14' has a thickness that is electrically equivalent to less than approximately 20 Angstroms of $SiO_2$. The fourth dielectric 30 is the bulk dielectric, meaning that the largest contribution to the dielectric constant of the alternative gate electrode 14' comes from the fourth dielectric 30. In one embodiment, the third dielectric 28 and the fifth dielectric 32 are at least one monolayer in thickness and the fourth dielectric 30 is at least twice as physically thick as each of the third dielectric 28 and the fifth dielectric 32.

In a preferred embodiment, the third dielectric 28 and the fifth dielectric 32 are the same material. In one embodiment, the third dielectric 28 and the fifth dielectric 32 are $ZrO_2$ or $HfO_2$ and the fourth dielectric 30 is $HfO_2$ or $ZrO_2$ and different than the third dielectric and the fifth dielectric 32. In another embodiment, the fifth dielectric 32 is $Al_2O_3$, the fourth dielectric 30 is $HfO_2$ and the third dielectric 28 is either $Al_2O_3$ or an oxynitride, such as silicon nitride.

Both the third dielectric 28 and the fifth dielectric 32 can serve as barrier layers for diffusion of boron, as should be appreciated from the above discussion, and other elements. For example, if the fifth dielectric 32 is $Al_2O_3$, the $Al_2O_3$ will prevent or minimize oxygen diffusing from $HfO_2$, which is the fourth dielectric 30, to the semiconductor substrate 12 and oxidizing the semiconductor substrate 12. Oxidation of the semiconductor substrate 12 can be undesirable because, for example, if the semiconductor substrate 12 is silicon a thick silicon dioxide layer can be formed on the semiconductor substrate 12 and decrease the overall dielectric constant of the alternative gate dielectric 14'.

In the embodiment where the third dielectric 28 and the fifth dielectric 32 are $HfO_2$ and the fourth dielectric 30 is $ZrO_2$, the $HfO_2$ is in contact with all silicon, if present in the gate electrode 16 and the semiconductor substrate 12. Therefore, the undesirable interaction between $ZrO_2$ and polysilicon is prevented.

In another embodiment, the alternative gate dielectric 14' can have a dielectric constant with a graded profile. For example, the third dielectric 28 can be $HfO_2$, the fourth dielectric 30 can be HfSiO and the fifth dielectric 32 can be SiO2. All materials can be formed by CVD, PVD, ALD, the like, or combinations of the above.

By now it should be appreciated that there has been provided gate dielectrics which prevent or minimize boron diffusion and have dielectric constants greater than that of silicon dioxide.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

In the foregoing specification, the invention has been described with reference to specific embodiments. However, one of ordinary skill in the art appreciates that various modifications and changes can be made without departing from the scope of the present invention as set forth in the claims below. For example, silicon dioxide (a native oxide)

may be present under either the second dielectric 26 or the fifth dielectric 32 if the semiconductor substrate 12 includes silicon and is exposed to an environment having oxygen after formation of the top surface of the semiconductor substrate 12 and formation of either the second dielectric 26 or the fifth dielectric 32. If the native oxide is inherently formed is approximately less than 12 Angstroms. The thickness of the native oxide may increase due to subsequent semiconductor processing. Additionally, other dielectric materials can be used, preferably in conjunction with HfO2, in the gate dielectric 14 and the alternative gate dielectric 14'. Also, the same dielectric material can be used for the gate dielectric 14 in FIG. 2. By changing the deposition processes for forming the first dielectric 24 and the second dielectric 26 and/or by breaking vacuum between depositing the first dielectric 24 and the second dielectric 26 will result in the first dielectric 24 and the second dielectric 26 having misaligned grain boundaries. As previously explained, misaligned grain boundaries prevent or at least minimize diffusion of elements, such as boron. Accordingly, the specification and figures are to be regarded in an illustrative rather than a restrictive sense, and all such modifications are intended to be included within the scope of the present invention.

Although the invention has been described with respect to specific conductivity types or polarity of potentials, skilled artisans appreciated that conductivity types and polarities of potentials may be reversed.

Moreover, the terms front, back, top, bottom, over, under and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. In a transistor device, a gate dielectric comprising:
   a first layer comprising hafnium oxide; and
   a second layer, under the first layer, comprising zirconium oxide.

2. The transistor device of claim 1, wherein the gate dielectric is present between a semiconductor substrate and a gate electrode of the transistor device, and wherein the hafnium oxide is under the gate electrode.

3. The transistor device of claim 2, wherein the gate dielectric further comprises a third layer, under the first layer, comprising a second metal oxide different from hafnium oxide.

4. The transistor device of claim 1, wherein the gate dielectric is present between a semiconductor substrate and a gate electrode of the transistor device, and wherein the zirconium oxide is over the semiconductor substrate.

5. A transistor device, comprising:
   a semiconductor substrate having a source, a drain, and a channel between the source and the drain;
   a gate electrode over the channel; and
   a gate dielectric comprising a first layer of substantially pure hafnium oxide and a second layer, under the first layer, wherein the second layer comprises zirconium oxide.

6. The transistor device of claim 5, wherein the gate dielectric further comprises a third layer of the substantially pure metal oxide, wherein the third layer is under the semiconductor substrate over the channel, the first layer is over the third layer, and the second layer is over the first layer.

7. The transistor device of claim 5, wherein the second layer is deposited by ALD.

* * * * *